US008896363B2

(12) United States Patent
Chen et al.

(10) Patent No.: US 8,896,363 B2
(45) Date of Patent: Nov. 25, 2014

(54) ANALOG SWITCHING CIRCUIT, ASSOCIATED CONTROL CIRCUIT AND METHOD

(71) Applicant: Monolithic Power Systems, Inc., San Jose, CA (US)

(72) Inventors: Da Chen, Chengdu (CN); Zhengwei Zhang, Chengdu (CN); Wei Mao, Chengdu (CN)

(73) Assignee: Monolithic Power Systems, Inc., San Jose, CA (US)

( * ) Notice: Subject to any disclaimer, the term of this patent is extended or adjusted under 35 U.S.C. 154(b) by 0 days.

(21) Appl. No.: 13/889,156

(22) Filed: May 7, 2013

(65) Prior Publication Data

US 2013/0300493 A1 Nov. 14, 2013

(30) Foreign Application Priority Data

May 8, 2012 (CN) ...................... 2012 2 0202095 U

(51) Int. Cl.
*H03K 17/00* (2006.01)
*H03K 17/687* (2006.01)

(52) U.S. Cl.
CPC ................................ *H03K 17/687* (2013.01)
USPC .......................................... 327/404; 327/437

(58) Field of Classification Search
USPC ................................................. 327/404, 437
See application file for complete search history.

(56) References Cited

U.S. PATENT DOCUMENTS

| | | | | |
|---|---|---|---|---|
| 3,866,064 A | * | 2/1975 | Gregory et al. | 327/437 |
| 4,529,897 A | * | 7/1985 | Suzuki et al. | 327/437 |
| 6,020,778 A | * | 2/2000 | Shigehara et al. | 327/534 |
| 7,724,067 B1 | * | 5/2010 | Tu et al. | 327/427 |
| 7,728,649 B1 | * | 6/2010 | Webb et al. | 327/534 |
| 7,834,677 B2 | * | 11/2010 | Yu | 327/391 |
| 7,924,085 B2 | * | 4/2011 | Guo | 327/534 |
| 8,212,604 B2 | * | 7/2012 | Dianbo | 327/389 |
| 8,344,789 B2 | * | 1/2013 | Webb | 327/534 |
| 8,368,453 B2 | * | 2/2013 | Company Bosch et al. | 327/427 |
| 2003/0016072 A1 | * | 1/2003 | Ramakrishnan | 327/434 |
| 2004/0196089 A1 | * | 10/2004 | O'Donnell et al. | 327/437 |
| 2011/0148507 A1 | * | 6/2011 | Wu et al. | 327/437 |

\* cited by examiner

*Primary Examiner* — Thomas J Hiltunen
(74) *Attorney, Agent, or Firm* — Perkins Coie, LLP

(57) ABSTRACT

The present invention discloses an analog switching circuit having a first terminal receiving an input signal, a second terminal providing an output signal and a control terminal receiving a switching control signal. The analog switching circuit has a first logic circuit providing a first control signal and a second control signal based on the switching control signal; an NMOS and a PMOS coupled between the first terminal and the second terminal, and controlled by the first control signal and the second control signal respectively; a first control circuit controls the backgate voltage of the NMOS based on the input signal and the switching control signal; and a second control circuit controls the backgate voltage of the PMOS based on the input signal and the switching control signal.

16 Claims, 5 Drawing Sheets

ANALOG SWITCHING CIRCUIT, ASSOCIATED CONTROL CIRCUIT AND METHOD

CROSS-REFERENCE TO RELATED APPLICATION(S)

This application claims priority to and the benefit of Chinese Patent Application No. 201220202095.1, filed May 8, 2012, which is incorporated herein by reference in its entirety.

TECHNICAL FIELD

The present invention relates to electrical circuit, more particularly but not exclusively relates to analog switching circuit and associated control circuit.

BACKGROUND

Analog switch is a type of interface for passing or blocking analog signal between analog circuit and digital control circuit. Along with the development of integrated circuits (IC) in the past few years, the technique in analog switch is improved a lot, in that it can work under very low voltage, have very low conduction resistance and very small packaging size. Due to these improvements, analog switches are widely used in sensing apparatuses, communication products and multi-media systems, etc.

A standard complementary metal oxide semiconductor (CMOS) analog switch comprises an n-channel MOS (NMOS) and a p-channel MOS (PMOS) that is coupled in parallel with the NMOS. The CMOS analog switch allows signals transfer bi-directionally. However, this parallel configuration leads that the conduction resistance changes along with the voltage of the input signal. At the meantime, the power supply voltage affects the conduction resistance a lot, and the conduction resistance will remarkably increase when the supply voltage decreases. In one example, when the power supply voltage is 5 volts, the conduction resistance of a conventional CMOS analog switch is about 8 ohms, and when the supply voltage is set in 12 volts, the conduction resistance of the CMOS analog switch decreases to about 3 ohms.

Conduction resistance for conventional CMOS analog switch in rated input voltage range and rated power supply voltage range changes a lot, thus the flatness of conduction resistance is poor. Accordingly, it becomes a critical problem for analog switch on keeping the flatness of conduction resistance with changing input voltage and power supply voltage.

SUMMARY

One embodiment of the present invention discloses an analog switching circuit having a first terminal, a second terminal and a control terminal, wherein the first terminal is configured to receive an input signal, the second terminal is configured to provide an output signal, and the control terminal is configured to receive a switching control signal, the analog switching circuit comprising: a first logic circuit having an input, a first output and a second output, wherein the input is electrically coupled to the control terminal configured to receive the switching control signal, the first output is configured to provide a first control signal and the second output is configured to provide a second control signal; an N-type metal oxide semiconductor field effect transistor (NMOS) having a source, a drain, a gate and a backgate, wherein the source is electrically coupled to the first terminal, the drain is electrically coupled to the second terminal, and the gate is configured to receive the first control signal; a P-type metal oxide semiconductor field effect transistor (PMOS) having a source, a drain, a gate and a backgate, wherein the source of the PMOS is electrically coupled to the first terminal, the drain of the PMOS is electrically coupled to the second terminal, and the gate is configured to receive the second control signal; a first control circuit, having a first input, a second input and an output, wherein the first input is electrically coupled to the first terminal, the second input is electrically coupled to the control terminal, and the output is electrically coupled to the backgate of the NMOS, and further wherein the first control circuit is configured to control the backgate voltage of the NMOS based on the input signal and the switching control signal; and a second control circuit, having a first input, a second input and an output, wherein the first input of the second control circuit is electrically coupled to the first terminal, the second input of the second control circuit is electrically coupled to the control terminal, and the output is electrically coupled to the backgate of the PMOS, and further wherein the second control circuit is configured to control the backgate voltage of the PMOS based on the input signal and the switching control signal.

Another embodiment of the present invention discloses a control circuit for controlling an analog switch, the analog switch having a first terminal, a second terminal and a control terminal, and the analog switch comprising a NMOS and a PMOS coupled in parallel with the NMOS, wherein the control circuit has a first input electrically coupled to the first terminal, a second input electrically coupled to the control terminal, a first output electrically coupled to a backgate of the NMOS and a second output electrically coupled to a backgate of the PMOS.

Yet another embodiment of the present invention discloses a method of controlling an analog switch, the analog switch receiving an input signal and a switching control signal and outputting an output signal based on the input signal and the switching control signal, the analog switch comprising an NMOS and a PMOS coupled in parallel with the NMOS, the method comprising: when the switching control signal is in a first logic state, turning ON the NMOS and the PMOS, and controlling a backgate voltage of the NMOS and a backgate voltage of the PMOS to follow the input signal; and when the switching control signal is in a second logic state different from the first logic state, turning OFF the NMOS and coupling the backgate voltage of the NMOS to a ground voltage; and turning OFF the PMOS and coupling the backgate voltage of the PMOS to a voltage source.

BRIEF DESCRIPTION OF THE DRAWINGS

Non-limiting and non-exhaustive embodiments are described with reference to the following drawings.

The use of the same reference label in different drawings indicates the same or like components.

DETAILED DESCRIPTION

In the present disclosure, numerous specific details are provided, such as examples of circuits, components, and methods, to provide a thorough understanding of embodiments of the invention. These embodiments are exemplary, not to confine the scope of the invention. Persons of ordinary skill in the art will recognize, however, that the invention can be practiced without one or more of the specific details. In other instances, well-known details are not shown or described to avoid obscuring aspects of the invention. Some phrases are used in some exemplary embodiments. However, the usage of these phrases is not confined to these embodiments.

Figure 1:
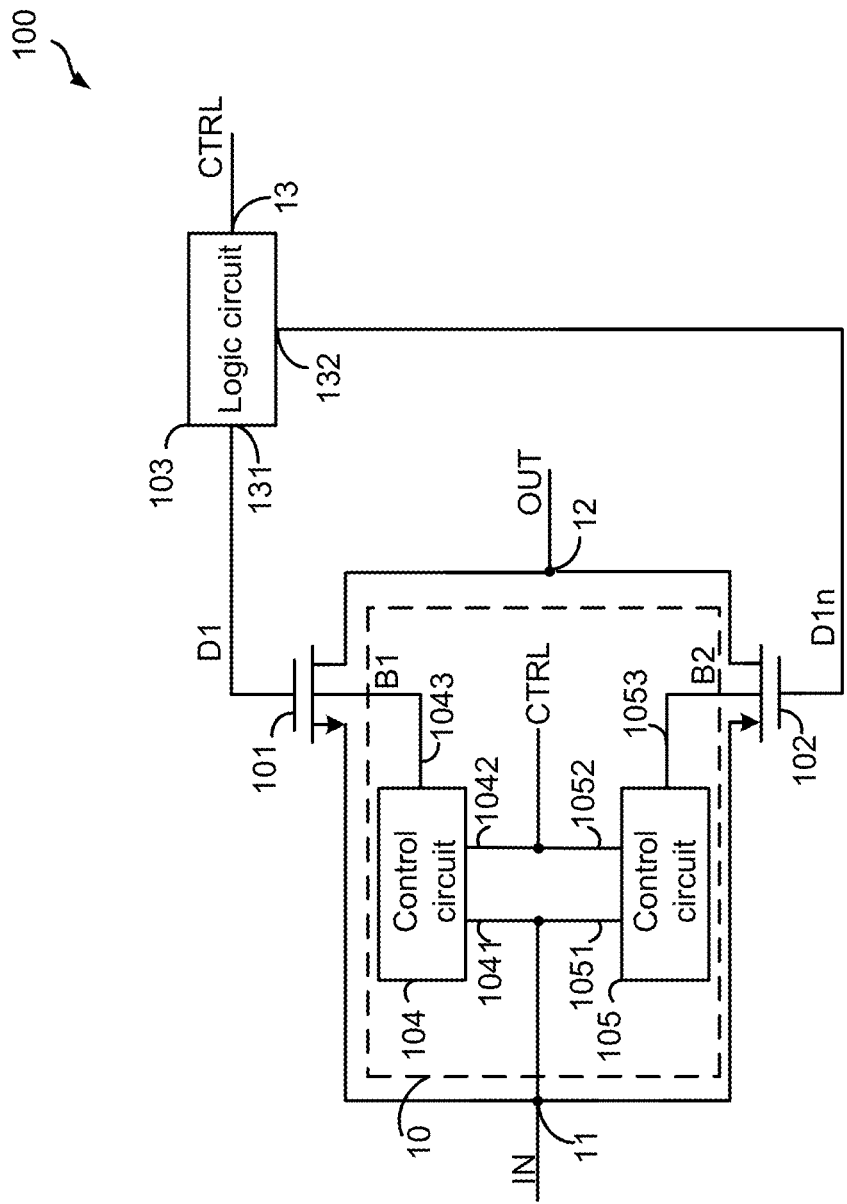
FIG. 1 shows a block diagram of an analog switching circuit 100 according to an embodiment of the present invention.

FIG. 1 shows a block diagram of an analog switching circuit 100 according to an embodiment of the present invention. As shown in FIG. 1, analog switching circuit 100 comprises an NMOS 101, a PMOS 102 and a control circuit 10. Analog switching circuit 100 has a first terminal 11, a second terminal 12 and a control terminal 13, wherein the first terminal 11 receives an input signal IN, the second terminal 12 provides an output signal OUT, and the control terminal 13 receives a switching control signal CTRL.

NMOS 101 and PMOS 102 are coupled in parallel. An analog switch comprising NMOS 101 and PMOS 102 has the first terminal 11, the second terminal 12 and the control terminal 13. The sources of NMOS 101 and PMOS 102 are coupled to the input terminal 11 to receive the input signal IN, the gates of NMOS 101 and PMOS 102 are coupled to the control terminal 13 and controlled by the switching control signal CTRL, and the drains of NMOS 101 and PMOS 102 provide an output signal OUT at the output terminal 12. When the switching control signal CTRL is in effective state, for example in logic HIGH (CTRL=1), the analog switching circuit 100 is in ON state and NMOS 101 and PMOS 102 are turned ON. At the meantime, the output signal OUT changes in accordance with the input signal IN. When the switching control signal CTRL is in ineffective state (CTRL=0), the analog switching circuit 100 is in OFF state, and NMOS 101 and PMOS 102 are turned OFF. NMOS 101 has a source, a drain, a gate and a backgate. The source of NMOS 101 is coupled to the first terminal 11 of analog switching circuit 100 configured to receive the input signal IN. The drain of NMOS 101 is coupled to the second terminal 12 of analog switching circuit 100 configured to provide the output signal OUT. The gate of NMOS 101 receives a first control signal D1. When the switching control signal CTRL is in effective state, control signal D1 is in logic HIGH configured to turn ON NMOS 101, and when the switching control signal CTRL is in ineffective state, control signal D1 is in logic LOW configured to turn OFF NMOS 101. PMOS 102 has a source, a drain, a gate and a backgate. The source of PMOS 102 is coupled to the first terminal 11 of analog switching circuit 100 configured to receive the input signal IN. The drain of PMOS 102 is coupled to the second terminal 12 of analog switching circuit 100 configured to provide the output signal OUT. The gate of PMOS 102 receives a second control signal D1n. When the switching control signal CTRL is in effective state, control signal D1n is in logic LOW configured to turn ON PMOS 102, and when the switching control signal CTRL is in ineffective state, control signal D1n is in logic HIGH configured to turn OFF PMOS 102. In one embodiment, when the switching control signal CTRL is in HIGH voltage level, control signal D1 is in HIGH voltage level to turn ON NMOS 101, and control signal D1n is in LOW voltage level to turn ON PMOS 102. And when the switching control signal CTRL is in LOW voltage level, control signal D1 is in LOW voltage level to turn OFF NMOS 101, and control signal D1n is in HIGH voltage level to turn OFF PMOS 102. And in another embodiment, when the switching control signal CTRL is in LOW voltage level, control signal D1 is in HIGH voltage level to turn ON NMOS 101, and control signal D1n is in LOW voltage level to turn ON PMOS 102; and when the switching control signal CTRL is in HIGH voltage level, control signal D1 is in LOW voltage level to turn OFF NMOS 101, and control signal D1n is in HIGH voltage level to turn OFF PMOS 102.

Based on the input signal IN and the switching control signal CTRL, control circuit 10 outputs a control signal B1 to control the backgate voltage of NMOS 101, and a control signal B2 to control the backgate voltage of PMOS 102. In one embodiment, control circuit 10 comprises a first control circuit 104 and a second control circuit 105. The first control circuit 104 has a first input 1041, a second input 1042 and an output 1043. The first input 1041 of the first control circuit 104 is electrically coupled to the first terminal 11 of analog switching circuit 100 to receive the input signal IN. The second input 1042 is electrically coupled to the control terminal 13 to receive the switching control signal CTRL. The output 1043 provides the control signal B1 generated based on the input signal IN and the switching control signal CTRL. When the switching control signal CTRL is in effective state, the first control circuit 104 electrically couples the control signal B1 to the first terminal 11 of the analog switching circuit 100. Or otherwise, when the switching control signal CTRL is in ineffective state, the first control circuit 104 electrically couples control signal B1 to a reference ground.

The second control circuit 105 has a first input 1051, a second input 1052 and an output 1053. The first input 1051 is electrically coupled to the first terminal 11 of analog switching circuit 100 to receive the input signal IN. The second input 1052 is electrically coupled to the control terminal 13 of analog switching circuit 100 to receive the switching control signal CTRL. The output 1053 provides control signal B2 based on the input signal IN and the switching control signal CTRL. When the switching control signal CTRL is in effective state, the second control circuit 105 couples the control signal B2 to the first terminal 11 of analog switching circuit 100. Or otherwise, when the switching control signal CTRL is in ineffective state, the second control circuit 105 electrically couples control signal B2 to a voltage source, for example a power supply source.

In one embodiment, analog switching circuit 100 further comprises a first logic circuit 103. First logic circuit 103 has an input electrically coupled to the control terminal 13 to receive the switching control signal CTRL. A first output 131 of first logic circuit 103 is electrically coupled to the gate of NMOS 101 to provide the first control signal D1. A second output 132 of first logic circuit 103 is electrically coupled to the gate of PMOS 102 to provide the second control signal D1n. When the switching control signal CTRL is in effective state, for example in logic HIGH, control signal D1 is in logic HIGH to turn ON NMOS 101 and control signal D1n is in logic LOW to turn ON PMOS 102. Or otherwise, when the switching control signal CTRL is in ineffective state, for example in logic LOW, control signal D1 is in logic LOW to turn OFF NMOS 101 and control signal D1n is in logic HIGH to turn OFF PMOS 102. Persons of ordinary skill in the art will recognize that the effective state of the switching control signal CTRL may be in either HIGH voltage level or LOW voltage level, and correspondingly the ineffective state of CTRL may be in either LOW voltage level or HIGH voltage level.

Figure 2:
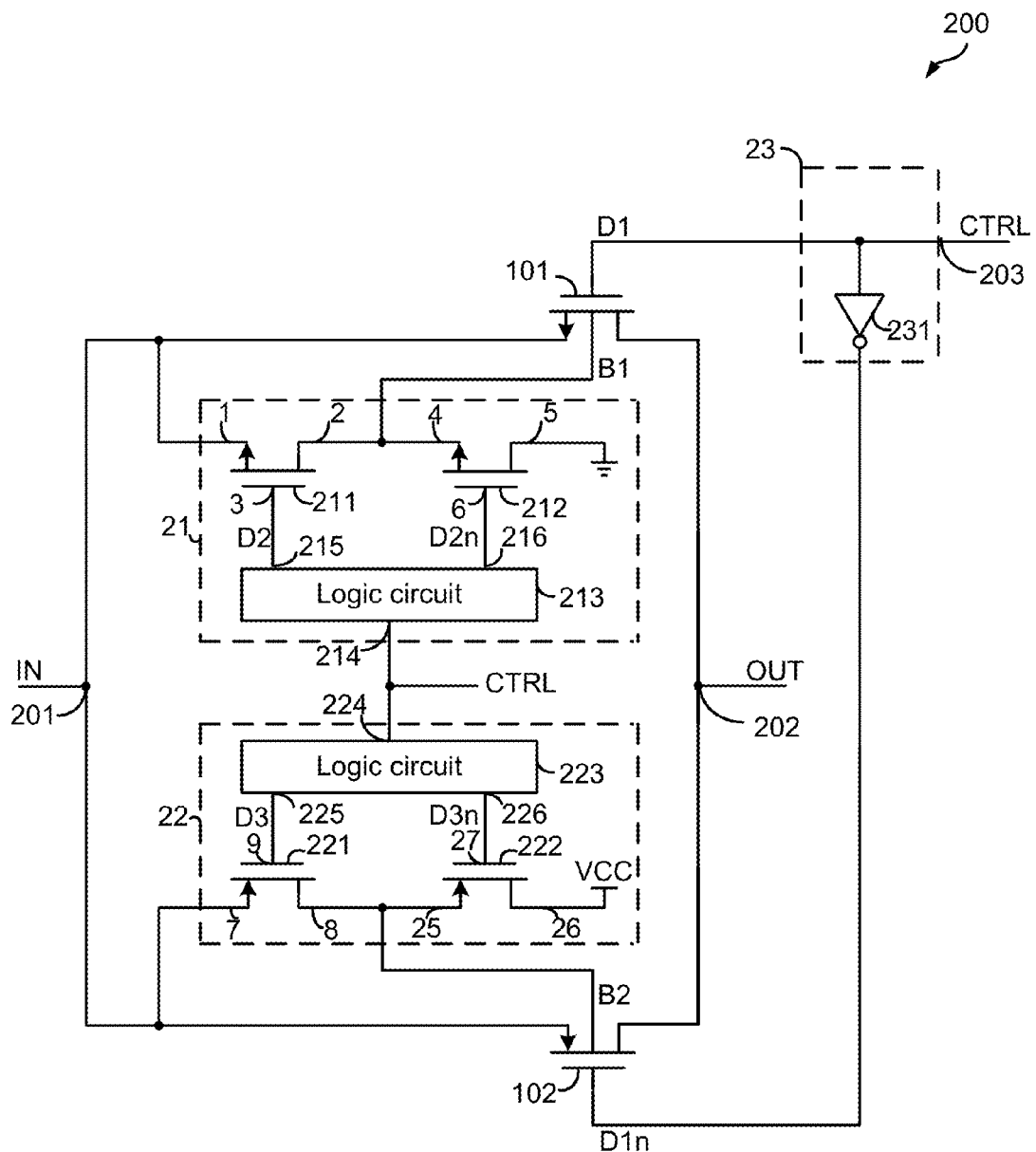
FIG. 2 shows a circuit diagram of an analog switching circuit 200 according to embodiment of the present invention.

FIG. 2 shows a circuit diagram of an analog switching circuit 200 according to an embodiment of the present invention. Similar to analog switching circuit 100 as shown in FIG. 1, analog switching circuit 200 has an input terminal 201 receiving an input signal IN, an output terminal 202 providing an output signal OUT, and a control terminal 203 receiving a switching control signal CTRL. Analog switching circuit 200 comprises an NMOS 101, a PMOS 102, a control circuit 21, a control circuit 22 and a first logic circuit 23.

Control circuit 21 receives the input signal IN and the switching control signal CTRL, and outputs a control signal B1 to adjust the voltage at backgate of NMOS 101. Control circuit 21 comprises a first control switch, a second control switch 212 and a second logic circuit 213. Control switch 211 has a first end 1 coupled to the input terminal 201 of analog switching circuit 200 to receive the input signal IN, a second end 2 coupled to the backgate of NMOS 101, and a control end 3 configured to receive a third control signal D2. When the switching control signal CTRL is in effective state, control switch 211 is turned ON, and when the switching control signal CTRL is in ineffective state, control switch 211 is turned OFF. The second control switch 212 has a first end 4 coupled to the backgate of NMOS 101, a second end 5 coupled to the reference ground and a control end 6 configured to receive a fourth control signal D2n. When the switching control signal CTRL is in effective state, control switch 212 is turned OFF, and when the switching control signal CTRL is in ineffective state, control switch 212 is turned ON.

In one embodiment, when signal CTRL is in effective state, control switch 211 is turned ON, and control switch 212 is turned OFF. Accordingly, the backgate of NMOS 101 is electrically coupled to the input terminal 201 of analog switching circuit 200 via control switch 211, and the backgate voltage VB1 of NMOS 101 changes based on the input signal IN. In one embodiment, when signal CTRL is in effective state, the backgate voltage VB1 of NMOS 101 is:

$VB1=VIN-VDS1$;

Where VIN represents the input voltage of the input signal IN, and VDS1 represents the drain-source voltage of control switch 211. In one embodiment, when signal CTRL is in ineffective state, control switch 211 is turned OFF, and control switch 212 is turned ON. Accordingly, the backgate of NMOS 101 is electrically coupled to the reference ground via control switch 212. In one embodiment, when signal CTRL is in ineffective state, the backgate voltage of NMOS 101 is:

$VB1=VDS2$;

Where VDS2 represents the drain-source voltage of control switch 212.

The first control switch 211 and the second control switch 212 may be bipolar transistor, field effect transistor or any other possible switching devices. In the shown embodiment in FIG. 2, control switch 211 is an NMOS, and when the switching control signal CTRL is in effective state, control signal D2 is in logic HIGH to turn ON control switch 211. And when the switching control signal CTRL is in ineffective state, control signal D2 is in logic LOW to turn OFF control switch 211. In the embodiment as shown in FIG. 2, control switch 212 is an NMOS. When the switching control signal CTRL is in effective state, control signal D2n is in logic LOW to turn OFF control switch 212, and when the switching control signal CTRL is in ineffective state, control signal D2n is in logic HIGH to turn ON control switch 212. Persons of ordinary skill in the art will recognize that control switch 211 and/or control switch 212 may be PMOS.

Second logic circuit 213 has an input 214 receiving the switching control signal CTRL, a first output 215 providing control signal D2, and a second output 216 providing control signal D2n. In the embodiment with reference to FIG. 2, control switch 211 and control switch 212 are NMOS, and the effective states of control signal D2 and control signal D2n are in logic HIGH. When the switching control signal CTRL is in effective state, control signal D2 is in logic HIGH and control signal D2n is in logic LOW. In one embodiment, the first control signals D1 and the third control signal D2 have the same voltage level. In one embodiment, the third control signal D2 and the fourth control signal D2n are in complementary pattern, and would not be simultaneously in effective state, and thus control switch 211 and control switch 212 would not be turned ON simultaneously.

In one embodiment, logic circuit 213 may comprise an RS flip latch. In one embodiment, a RESET input of the RS flip latch receives the switching control signal CTRL, a SET input of the RS flip latch receives an inverse signal of the switching control signal CTRL, a first output of the RS flip latch outputs control signal D2n and a second output of RS flip latch outputs control signal D2.

Control circuit 22 receives the input signal IN and the switching control signal CTRL, and outputs control signal B2 to adjust the backgate voltage of PMOS 102. Control circuit 22 comprises a third control switch 221, a fourth control switch 222 and a third logic circuit 223. Control switch 221 has a first end 7, a second end 8 and a control end 9, wherein the first end 7 is electrically coupled to the input terminal 201 of analog switching circuit 200 to receive the input signal IN, the second end 8 is electrically coupled to the backgate of PMOS 102, and the control end 9 receives a fifth control signal D3 such that when the switching control signal CTRL is in effective state, the control switch 221 is turned ON, and when the switching control signal CTRL is in ineffective state, the control switch 221 is turned OFF. Control switch 222 has a first end 25, a second end 26 and a control end 27, wherein the first end 25 is electrically coupled to the backgate of PMOS 102, the second end 26 is coupled to a voltage source, such as a power supply voltage VCC, and the control end 27 receives a sixth control signal D3n such that when the switching control signal CTRL is in effective sate, control switch 222 is turned OFF and when the switching control signal CTRL is in ineffective state, control switch 222 is turned ON.

In one embodiment, when the switching control signal CTRL is in effective state, control switch 221 is turned ON and control switch 222 is turned OFF, the backgate of PMOS 102 is electrically coupled to the input terminal 201 of analog switching circuit 200 via control switch 221, and the voltage VB2 at backgate of PMOS 102 changes with the input signal IN. In one embodiment, when the switching control signal CTRL is in effective state, the backgate voltage VB2 of PMOS 102 is:

$VB2=VIN-VDS3$;

Where VDS3 represents the drain-source voltage of control switch 221.

In one embodiment, when the switching control signal CTRL is in ineffective state, control switch 221 is turned OFF and control switch 222 is turned ON, the backgate voltage of PMOS 102 is electrically coupled to a voltage source, such as power supply voltage VCC, and the backgate voltage VB2 of PMOS 102 is:

$$VB2=VCC+VDS4;$$

Where VDS4 represents the drain-source voltage of control switch 222.

Control switch 221 and/or control switch 222 may be bipolar transistor, field effect transistor or any other suitable switch. In the embodiment as shown in FIG. 2, control switch 221 comprises a PMOS. When the switching control signal CTRL is in effective state, control signal D3 is in logic LOW to turn ON control switch 221, and when the switching control signal CTRL is in ineffective state, control signal D3 is in logic HIGH to turn OFF control switch 221. In the embodiment as shown in FIG. 2, control switch 222 comprises a PMOS. When the switching control signal CTRL is in effective state, control signal D3$n$ is in logic HIGH to turn OFF control switch 222, and when the switching control signal CTRL is in ineffective state, control signal D3$n$ is in logic LOW to turn ON control switch 222. Persons of ordinary skill in the art will recognize that control switch 221 and/or control switch 222 may be NMOS.

Third logic circuit 223 has an input 224 receiving the switching control signal CTRL, a first output 225 providing control signal D3, and a second output 226 providing control signal D3$n$. In the embodiment with reference to FIG. 2, control switch 221 and control switch 222 are PMOS, the effective states of control signal D3 and control signal D3$n$ are in LOW voltage level. When the switching control signal CTRL is in effective state, control signal D3 is in LOW voltage level and control signal D3$n$ is in HIGH voltage level. In one embodiment, the fifth control signal D3 and the second control signal D1$n$ have the same voltage level. In one embodiment, the fifth control signal D3 and the sixth control signal D3$n$ are in complementary pattern, and would not be in effective state simultaneously, and thus control switch 221 and control switch 222 would not be turned ON simultaneously.

In one embodiment, third logic circuit 223 may comprise an RS flip latch. In one embodiment, a SET input of the RS flip latch receives the switching control signal CTRL, a RESET input of the RS flip latch receives an inverse signal of the switching control signal CTRL, a first output of the RS flip latch outputs control signal D3$n$ and a second output of RS flip latch outputs control signal D3.

The first logic circuit 23 receives the switching control signal CTRL, and outputs the first control signal D1 to the gate of NMOS 101 and the second control signal D1$n$ to the gate of PMOS 102. In the embodiment as shown in FIG. 2, the effective state of the switching control signal CTRL is in HIGH voltage level and the ineffective state of the switching control signal CTRL is in LOW voltage level. In one embodiment, the gate of NMOS 101 is electrically coupled directly to control terminal 203 of analog switching circuit 200 such that control signal D1 equals the switching control signal CTRL. In one embodiment, logic circuit 23 comprises a NOR gate 231 and the gate of PMOS 102 is electrically coupled to control terminal 203 of analog switching circuit 200 via NOR gate 231. Control signal D1$n$ is generated from the switching control signal CTRL via NOR gate 231

Figure 3A:
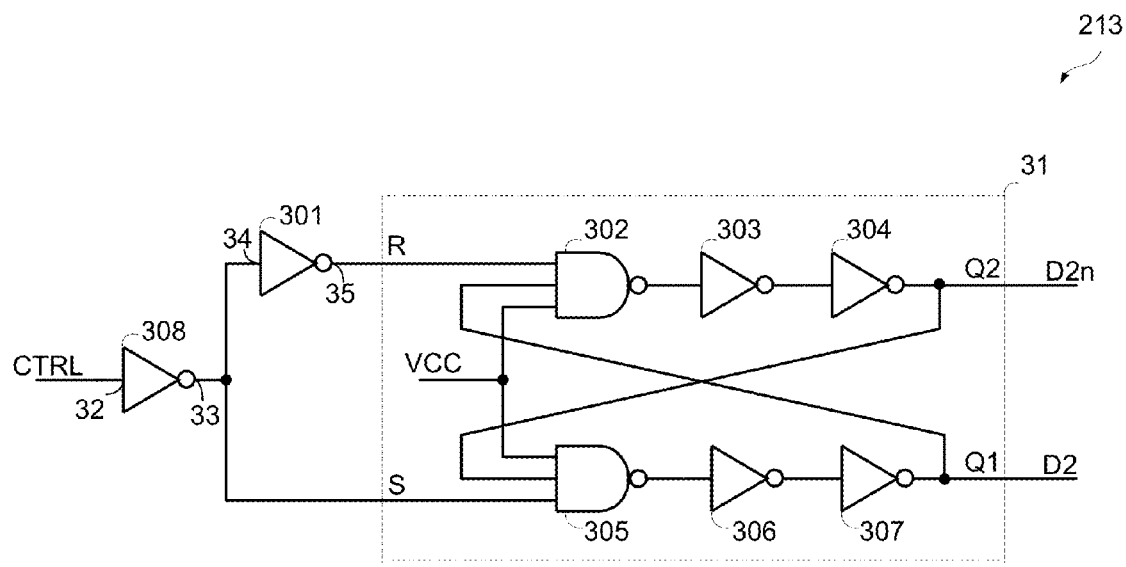
FIG. 3A shows a circuit diagram of a logic circuit 213 as shown in FIG. 2 according to an embodiment of the present invention.

FIG. 3A shows a circuit diagram of logic circuit 213 in FIG. 2 according to an embodiment of the present invention. Logic circuit 213 outputs the third control signal D2 and the fourth control signal D2$n$ according to the switching control signal CTRL. In the embodiment shown in FIG. 3A, the switching control signal CTRL is in effective state when in high voltage level, or CTRL=1, and the switching control signal CTRL is in ineffective state when in low voltage level, or CTRL=0.

Logic circuit 213 comprises an RS flip latch 31. RS flip latch 31 has a SET input S coupled to the control terminal of analog switching circuit, a RESET input R coupled to the control terminal of the analog switching circuit, a first output Q1 providing the third control signal D2 and a second output Q2 providing the fourth control signal D2$n$. When the switching control signal CTRL is in effective state, the SET input is enabled, and the third control signal D2 at the first output Q1 turns into effective state, for example in high voltage level to turn ON control switch 211. At the meantime, control signal D2$n$ at the second output Q2 is in ineffective state, for example in low voltage level to turn OFF control switch 212. When the switching control signal CTRL is in ineffective state, the RESET input is enabled, and the control signal D2 at the first output Q1 turns into ineffective state, for example in LOW voltage level to turn OFF control switch 211. At the meantime, control signal D2$n$ at the second output Q2 is in effective state, for example in HIGH voltage level to turn ON control switch 212.

In one embodiment, the effective states of signals at SET input S and RESET input R of RS flip latch 31 are in LOW voltage level. And in another embodiment, the effective states of signals at SET input S and RESET input R of RS flip latch 31 are in HIGH logic level.

In one embodiment, second logic circuit 213 comprises a NOR gate 308, a NOR gate 301 and an RS flip latch 31. NOR gate 308 has an input 32 and an output 33, wherein the input 32 receives the switching control signal CTRL. NOR gate 301 has an input 34 and an output 35, wherein input 34 is coupled to the output 33 of NOR gate 308. RS flip latch 31 has SET input S coupled to output 33 of NOR gate 308, RESET input R coupled to output 35 of NOR gate 301, the first output Q1 providing the third control signal D2 and a second output Q2 providing the fourth control signal D2$n$. In one embodiment, the effective states of the signals at SET input S and RESET input R of flip latch 31 are in LOW voltage level, and when SET input S receives LOW voltage signal, control signal D2 at the first output Q1 is set HIGH and control signal D2$n$ at the second output Q2 is in LOW voltage level. When the RESET input receives LOW voltage signal, control signal D2 at the first output Q1 is reset LOW and control signal D2$n$ at the second output Q2 is in HIGH voltage level.

In one embodiment, RS flip latch 31 comprises an ANR gate 302, a NOR gate 303, a NOR gate 304, an ANR gate 305, a NOR gate 306 and a NOR gate 307. ANR gate 302 has a first input coupled to the output of NOR gate 301, a second input receiving the third control signal D2, and an output; NOR gate 303 has an input coupled to the output of ANR gate 302, and an output; NOR gate 304 has an input coupled to the output of NOR gate 303, and an output providing control signal D2$n$; ANR gate 305 has a first input coupled to the output of NOR gate 308, a second input coupled to the output of NOR gate 304 to receive control signal D2$n$, and an output; NOR gate 306 has an input coupled to the output of ANR gate 305, and an output; NOR gate 307 has an input coupled to the output of NOR gate 306, and an output coupled to the second input of ANR gate 302 and providing the control signal D2.

In other embodiments, RS flip latch 31 may comprise any number of NOR gates.

In one embodiment, ANR gate 302 has a third input electrically coupled to the power supply voltage VCC, and ANR gate 305 has a third input electrically coupled to power supply voltage VCC.

Figure 3B:
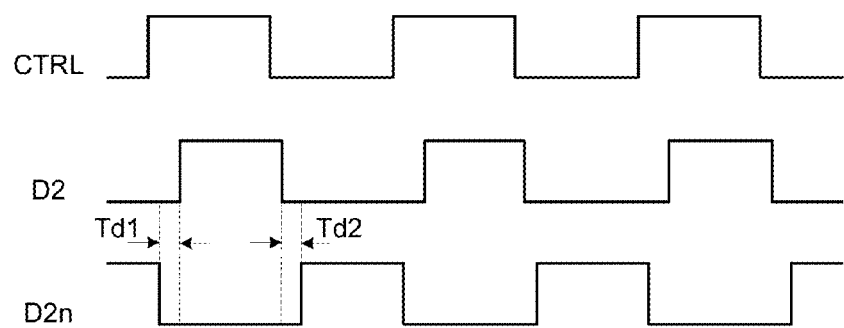
FIG. 3B shows a waveform diagram of the logic circuit as shown in FIG. 3A according to an embodiment of the present invention.

FIG. 3B shows a waveform diagram of the logic circuit shown in FIG. 3A according to an embodiment of the present invention.

In one embodiment, when the switching control signal CTRL is in logic HIGH (effective state), control signal D2 is in logic HIGH to turn ON control switch 211, and control signal D2n is in logic LOW to turn OFF control switch 212. And when the switching control signal CTRL is in logic LOW (ineffective state), control signal D2 is in logic LOW to turn OFF control switch 211, and control signal D2n is in logic HIGH to turn ON control switch 212.

In one embodiment, logic circuit 213 controls that control signals D2 and D2n are in complementary pattern, and would not be in logic HIGH simultaneously. When the switching control signal CTRL shifts from logic LOW to logic HIGH, signal D2n is changed from logic HIGH to Logic LOW. After a delay time of Td1, control signal D2 is changed from logic LOW to logic HIGH. And when the switching control signal CTRL shifts from logic HIGH to logic LOW, signal D2 is changed from logic HIGH to logic LOW, and after a delay time of Td2, control signal D2n is changed from logic LOW to logic HIGH.

Figure 4A:
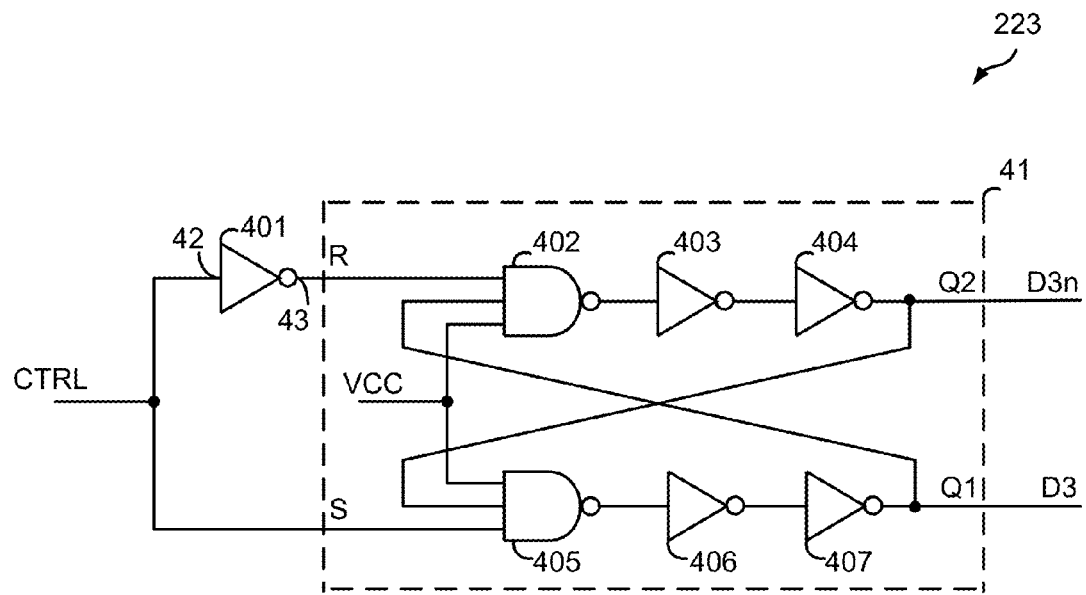
FIG. 4A shows a circuit diagram of a logic circuit 223 as shown in FIG. 2 according to an embodiment of the present invention.
Figure 4B:
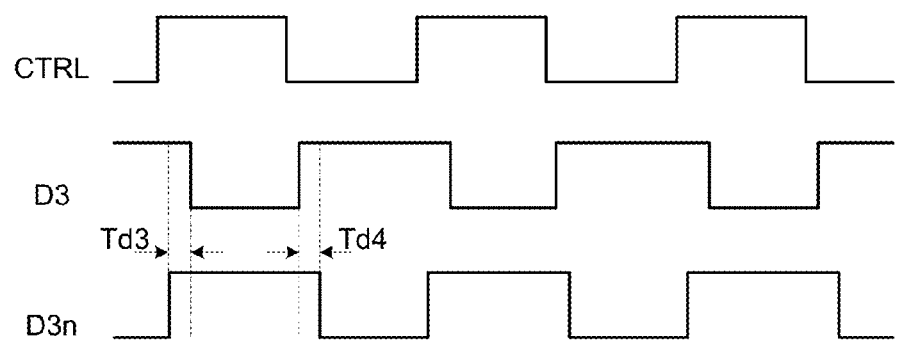
FIG. 4B shows a waveform diagram of the logic circuit as shown in FIG. 4A according to an embodiment of the present invention.

FIG. 4A shows a circuit diagram of a logic circuit 223 with reference to FIG. 2 according to an embodiment of the present invention. Logic circuit 223 outputs the fifth control signal D3 and the sixth control signal D3n according to the switching control signal CTRL. In the embodiment shown in FIG. 4A, the switching control signal CTRL is in effective state when CTRL=1, and the switching control signal CTRL is in ineffective state when CTRL=0.

Logic circuit 223 comprises an RS flip latch 41. RS flip latch 41 has a SET input S coupled to the control terminal of analog switching circuit, a RESET input R coupled to the control terminal of analog switching circuit, a first output Q1 providing the fifth control signal D3 and a second output Q2 providing the sixth control signal D3n. When the switching control signal CTRL is in effective state, SET input S is in effective state, and the first output provides effective control signal D3, for example logic LOW signal to turn ON control switch 221, and the second output Q2 provides ineffective control signal D3n, for example logic HIGH signal to turn OFF control switch 222. When the switching control signal CTRL is in ineffective state, RESET input R is in effective state, and the first output provides ineffective control signal D3, for example logic HIGH signal to turn OFF control switch 221, and the second output Q2 provides effective control signal D3n, for example logic LOW signal to turn ON control switch 222.

In one embodiment, the effective states of the signals at SET input S and RESET input of RS flip latch 41 are in logic LOW. And in another embodiment, the effective states of the signals at SET input S and RESET input R of RS flip latch 41 are in logic HIGH.

In one embodiment, logic circuit 223 comprises a NOR gate 401 and RS flip latch 41. NOR gate 401 has an input 42 and an output 43, wherein input 42 receives the switching control signal CTRL. RS flip latch 41 has the SET input S receiving the switching control signal CTRL, has the RESET input R coupled to output 43 of NOR gate 401, has the first output Q1 providing the fifth control signal D3, and has the second output Q2 providing the sixth control signal D3n. In one embodiment, the effective state for RS flip latch 41 is in logic LOW, or in other words when the SET input receives a logic LOW signal, control signal D3 provided at the first output Q1 is in logic LOW to turn ON PMOS 221, and control signal D3n provided at the second output Q2 is in logic HIGH to turn OFF PMOS 222; and when the RESET input receives a logic LOW signal, control signal D3 provided at the first output Q1 is in logic HIGH, and control signal D3n provided at the second output Q2 is in Logic LOW.

In one embodiment, RS flip latch 41 comprises an ANR gate 402, a NOR gate 403, a NOR gate 404, an ANR gate 405, a NOR gate 406 and a NOR gate 407. ANR gate 402 has a first input coupled to the output 43 of NOR gate 401, a second input receiving control signal D3, and an output; NOR gate 403 has an input coupled to the output of ANR gate 402 and an output; NOR gate 404 has an input coupled to the output of NOR gate 403, and an output providing control signal D3n; ANR gate 405 has a first input receiving the switching control signal CTRL, a second input coupled to the output of NOR gate 404, and an output; NOR gate 406 has an input coupled to the output of ANR gate 405, and an output; NOR gate 407 has an input coupled to the output of NOR gate 406, and an output coupled to the second input of ANR gate 402 and providing control signal D3.

In other embodiments, RS flip latch 41 may comprise any number of NOR gates.

In one embodiment, ANR 402 further has a third input coupled to a power supply voltage VCC. And ANR 405 further has a third input coupled to the power supply voltage VCC.

In one embodiment, when the switching control signal CTRL is in logic HIGH (effective state), control signal D3 is in logic LOW to turn ON control switch 221, and control signal D3n is in logic HIGH to turn OFF control switch 2222. And when the switching control signal CTRL is in logic LOW (ineffective state), control signal D3 is in logic HIGH to turn OFF control switch 221 and control signal D3n is in logic LOW to turn ON control switch 222.

In one embodiment, logic circuit 223 controls that control signals D3 and D3n are in complementary pattern, and would not be in logic LOW simultaneously. When the switching control signal CTRL changes from logic LOW to logic HIGH, control signal D3n changes from logic LOW to logic HIGH, and then after a time delay Td3, control signal D3 changes from logic HIGH to logic LOW. And when the switching control signal CTRL changes from logic HIGH to logic LOW, control signal D3 changes from logic LOW to logic HIGH, and then after a time delay Td4, control signal D3n changes from logic HIGH to logic LOW.

Figure 5:
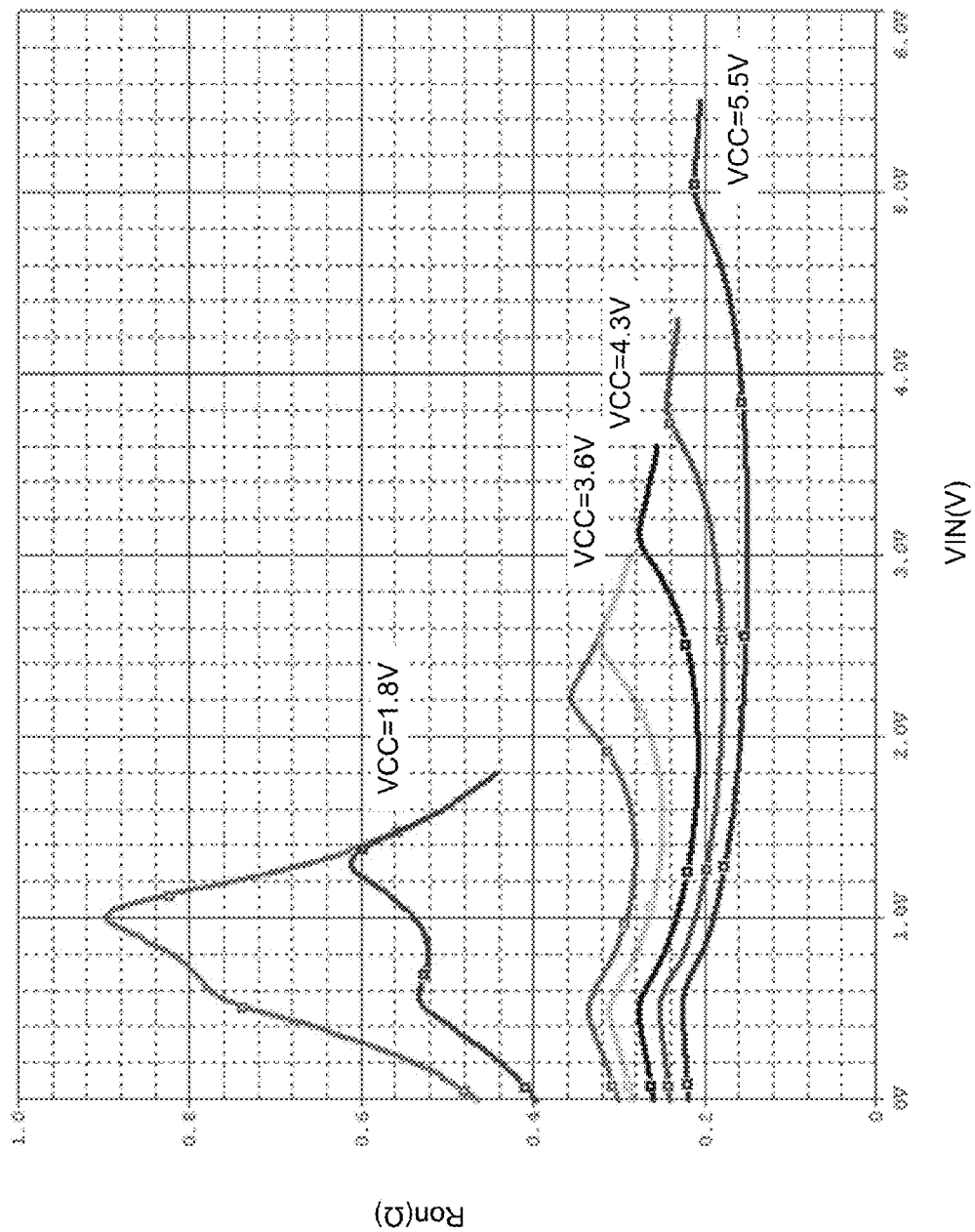
FIG. 5 shows a conduction resistance diagram of the analog switching circuit 200 as shown in FIG. 2 according to an embodiment of the present invention.

FIG. 5 shows a waveform diagram of the conducting resistance of the analog switching circuit 200 with reference to FIG. 2 according to an embodiment of the present invention. The curves in FIG. 5 illustrate the conducting resistance Ron as a function of the input voltage VIN under a plurality of power supply voltages VCC. The uppermost curve is obtained under a power supply voltage of VCC=1.8 Volts, and the conducting resistance Ron changes from 0.4 ohms to 0.61 ohms in the whole range of input voltage VIN. The second curve is obtained under a power supply voltage of VCC=3.6 Volts, and the conducting resistance Ron changes from 0.21 ohms to 0.28 ohms in the whole range of input voltage VIN. In the third curve, the power supply voltage is 4.3 Volts, and the conducting resistance changes from 0.18 ohms to 0.24 ohms in the whole range of input voltage VIN. And in the fourth curve, the power supply voltage VCC=5.5 volts, and the conducting resistance Ron changes from 0.15 ohms to 0.21 ohms in the whole range of input voltage VIN. It can be seen that by controlling the voltage at the backgate of the MOSFET, the flatness of conducting resistance is improved.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

We claim:

1. An analog switching circuit comprising:
a first terminal, a second terminal and a control terminal, wherein the first terminal is configured to receive an input signal, the second terminal is configured to provide an output signal, and the control terminal is configured to receive a switching control signal;
a first logic circuit having an input, a first output and a second output, wherein the input is electrically coupled to the control terminal configured to receive the switching control signal, the first output is configured to provide a first control signal and the second output is configured to provide a second control signal;
an N-type metal oxide semiconductor field effect transistor (NMOS) having a source, a drain, a gate and a backgate, wherein the source is electrically coupled to the first terminal, the drain is electrically coupled to the second terminal, and the gate is configured to receive the first control signal;
a P-type metal oxide semiconductor field effect transistor (PMOS) having a source, a drain, a gate and a backgate, wherein the source of the PMOS is electrically coupled to the first terminal, the drain of the PMOS is electrically coupled to the second terminal, and the gate is configured to receive the second control signal;
a first control circuit, having a first input, a second input and an output, wherein the first input is electrically coupled to the first terminal, the second input is electrically coupled to the control terminal, and the output is electrically coupled to the backgate of the NMOS, and further wherein the first control circuit is configured to control the backgate voltage of the NMOS based on the input signal and the switching control signal; and
a second control circuit, having a first input, a second input and an output, wherein the first input of the second control circuit is electrically coupled to the first terminal, the second input of the second control circuit is electrically coupled to the control terminal, and the output of the second control circuit is electrically coupled to the backgate of the PMOS, and further wherein the second control circuit is configured to control the backgate voltage of the PMOS based on the input signal and the switching control signal;
wherein the first control circuit comprises:
a first control switch, having a first end electrically coupled to the first terminal configured to receive the input signal, a second end electrically coupled to the backgate of the NMOS and a control end configured to receive a third control signal;
a second control switch, having a first end electrically coupled to the backgate of the NMOS, a second end electrically coupled to a reference ground and a control end configured to receive a fourth control signal; and
a first RS flip latch having a SET input, a RESET input, a first output and a second output, wherein the first output of the first RS flip latch is electrically coupled to the control end of the first control switch configured to provide the third control signal, and the second output of the first RS flip latch is electrically coupled to the control end of the second control switch configured to provide the fourth control signal;
wherein when the switching control signal is in a first logic state, the SET input is enabled, the first control switch is turned ON and the second control switch is turned OFF, and when the switching control signal is in a second logic state, the RESET input is enabled, the first control switch is turned OFF and the second control switch is turned ON.

2. The analog switching circuit of claim 1, wherein:
when the switching control signal is in a first logic state, the first control signal is in logic HIGH state to turn ON the NMOS; and
when the switching control signal is in a second logic state, the first control signal is in logic LOW state to turn OFF the NMOS.

3. The analog switching circuit of claim 1, wherein:
when the switching control signal is in a first logic state, the second control signal is in logic LOW state to turn ON the PMOS; and
when the switching control signal is in a second logic state, the second control signal is in logic HIGH state to turn OFF the PMOS.

4. The analog switching circuit of claim 1, wherein:
when the switching control signal is in a first logic state, the backgate of the NMOS is electrically coupled to the first terminal via the first control circuit configured to receive the input signal, and the backgate of the PMOS is electrically coupled to the first terminal via the second control circuit configured to receive the input signal; and
when the switching control signal is in a second logic state, the backgate of the NMOS is electrically coupled to a reference ground via the first control circuit, and the backgate of the PMOS is electrically coupled to a voltage source via the second control circuit.

5. The analog switching circuit of claim 1, wherein the first control switch and the second control switch are NMOS.

6. The analog switching circuit of claim 1, wherein the first control circuit further comprises a second logic circuit having an input, a first output and a second output, wherein the input of the second logic circuit is electrically coupled to the control terminal configured to receive the switching control signal, the first output of the second logic circuit is configured to provide the third control signal and the second output of the second logic circuit is configured to provide the fourth control signal.

7. The analog switching circuit of claim 1, wherein the second control circuit comprises:
a third control switch having a first end electrically coupled to the first terminal configured to receive the input signal, a second end electrically coupled to the backgate of the PMOS and a control end configured to receive a fifth control signal; and
a fourth control switch having a first end electrically coupled to the backgate of the PMOS, a second end electrically coupled to a voltage source and a control end configured to receive a sixth control signal; wherein
when the switching control signal is in a first logic state, the third control switch is turned ON and the fourth control switch is turned OFF, and when the switching control signal is in a second logic state, the third control switch is turned OFF and the fourth control switch is turned ON.

8. The analog switching circuit of claim 7, wherein the third control switch and the fourth control switch are PMOS.

9. The analog switching circuit of claim 7, wherein the second control circuit further comprises a third logic circuit having an input configured to receive the switching control signal, a first output configured to provide the fifth control signal and a second output configured to provide the sixth control signal.

10. The analog switching circuit of claim 7, wherein the second control circuit further comprises a second RS flip latch having a SET input, a RESET input, a first output and a second output, wherein the first output of the second RS flip latch is electrically coupled to the control end of the third control switch configured to provide the fifth control signal, and the second output of the second RS flip latch is electrically coupled to the control end of the fourth control switch configured to provide the sixth control signal; wherein when the switching control signal is in the first logic state, the SET input of the second RS flip latch is enabled, the third control switch is turned ON and the fourth control switch is turned OFF, and when the switching control signal is in the second logic state, the RESET input of the second RS flip latch is enabled, the third control switch is turned OFF and the fourth control switch is turned ON.

11. The analog switching circuit of claim 1 fabricated on a semiconductor substrate.

12. A control circuit for controlling an analog switch, the analog switch having a first terminal, a second terminal and a control terminal, and the analog switch comprising a NMOS and a PMOS coupled in parallel with the NMOS, wherein the control circuit has a first input electrically coupled to the first terminal, a second input electrically coupled to the control terminal, a first output electrically coupled to a backgate of the NMOS and a second output electrically coupled to a backgate of the PMOS, the control circuit comprising:

a first control switch having a first end, a second end and a control end, wherein the first end is electrically coupled to the first terminal, the second end is electrically coupled to the backgate of the NMOS;

a second control switch having a first end, a second end and a control end, wherein the first end of the second control switch is electrically coupled to the backqate of the NMOS, the second end of the second control switch is electrically coupled to a reference ground; and a second logic circuit having an input electrically coupled to the control terminal, a first output electrically coupled to the control end of the first control switch and a second output electrically coupled to the control end of the second control switch;

wherein the first control switch and the second control switch comprise NMOS, and the second logic circuit comprises a first RS flip latch, wherein the first RS flip latch comprises:

a SET input electrically coupled to the control terminal;
a RESET input electrically coupled to the control terminal;
a first output electrically coupled to the control end of the first control switch; and
a second output electrically coupled to the control end of the second control switch; wherein
when the SET input is enabled, the first control switch is turned ON and the second control switch is turned OFF, and when the RESET input is enabled, the first control switch is turned OFF and the second control switch is turned ON;

wherein the second output electrically coupled to the backgate of the PMOS is an output of a circuit element that is distinct from the RS flip latch.

13. The control circuit of claim 12, wherein the circuit element electrically coupled to the backgate of the PMOS transistor further comprises:

a third control switch having a first end, a second end and a control end, wherein the first end of the third control switch is electrically coupled to the first terminal, the second end of the third control switch is electrically coupled to the backgate of the PMOS;

a fourth control switch having a first end, a second end and a control end, wherein the first end of the fourth control switch is electrically coupled the backgate of the PMOS, the second end of the fourth control switch is electrically coupled to a voltage source; and a third logic circuit, having an input electrically coupled to the control terminal, a first output electrically coupled to the control end of the third control switch, and a second output electrically coupled to the control end of the fourth control switch; wherein the control circuit operates the analog switch such that when the analog switch is turned ON, the second logic circuit is configured to turn ON the first control switch and turn OFF the second control switch, and the third logic circuit is configured to turn ON the third control switch and turn OFF the fourth control switch; and when the analog switch is turned OFF, the second logic circuit is configured to turn OFF the first control switch and turn ON the second control switch, and the third logic circuit is configured to turn OFF the third control switch and turn ON the fourth control switch.

14. The control circuit of claim 13, wherein the third control switch and the fourth control switch comprise PMOS, and the third logic circuit comprises a second RS flip latch, wherein the second RS flip latch comprises:

a SET input electrically coupled to the control terminal;
a RESET input electrically coupled to the control terminal;
a first output electrically coupled to the control end of the third control switch; and
a second output electrically coupled to the control end of the fourth control switch; wherein
when the SET input is enabled, the third control switch is turned ON and the fourth control switch is turned OFF, and when the RESET input is enabled, the third control switch is turned OFF and the fourth control switch is turned ON.

15. A method of controlling an analog switch, the analog switch receiving an input signal and a switching control signal and outputting an output signal based on the input signal and the switching control signal, the analog switch comprising an NMOS and a PMOS coupled in parallel, the method comprising:

turning ON the NMOS and the PMOS when the switching control signal is in a first logic state, and controlling a backgate voltage of the NMOS and a backgate voltage of the PMOS to follow the input signal; and turning OFF the NMOS and coupling the backgate voltage of the NMOS to a ground voltage and turning OFF the PMOS and coupling the backgate voltage of the PMOS to a voltage source when the switching control signal is in a second logic state different from the first logic state;

wherein controlling the backgate voltage of the NMOS comprises:

adopting a first control switch to selectively couple the backgate of the NMOS to an input terminal of the analog switch;

adopting a second control switch to selectively couple the backgate of the NMOS to a reference ground;

coupling a control end of the first control switch to a first output of a RS flip latch, coupling a control end of the second control switch to a second output of the RS flip latch, wherein when the switching control signal is in a first logic state, a SET input of the RS flip latch is enabled, the first control switch is turned ON and the second control switch is turned OFF, and when the switching control signal is in a second logic state, a RESET of the RS flip latch is enabled, the first control switch is turned OFF and the second control switch is turned ON;

wherein a circuit element distinct from the RS flip latch controls the backgate the backgate voltage of the PMOS.

16. The method of claim 15, wherein controlling the backgate voltage of the PMOS comprises:

adopting a third control switch to selectively couple the backgate of the PMOS to an input terminal of the analog switch;

adopting a fourth control switch to selectively couple the backgate of the PMOS to a voltage source;

turning ON the third control switch and turning OFF the fourth control switch when the switching control signal is in the first logic state; and turning OFF the third control switch and turning ON the fourth control switch when the switching control signal is in the second logic state.

* * * * *